United States Patent [19]
Jiang

[11] Patent Number: 5,339,076
[45] Date of Patent: Aug. 16, 1994

[54] DATA COMPRESSION USING CONTENT ADDRESSABLE MEMORY

[75] Inventor: Ching-Lin Jiang, Palo Alto, Calif.

[73] Assignee: Integrated Information Technology, Santa Clara, Calif.

[21] Appl. No.: 876,771

[22] Filed: Apr. 27, 1992

[51] Int. Cl.⁵ ............................................. H03M 7/30
[52] U.S. Cl. ................................................. 341/51
[58] Field of Search ...................................... 341/51

[56] References Cited

U.S. PATENT DOCUMENTS 4,558,302 12/1985 Welch ................................... 341/51
5,151,697 9/1992 Bunton ................................. 341/51

Primary Examiner—Howard L. Williams
Attorney, Agent, or Firm—Skjerven, Morrill, MacPherson, Franklin & Friel

[57] ABSTRACT

A data compression/decompression processor implements a modified Ziv-Lempel ("LZ") coding technique. The processor includes three modules, an interface, a coder-decoder ("CODEC"), and a MODEL. The CODEC and the MODEL modules together form compression engine, in which the CODEC provides variable length coding and data packing, and the MODEL implements the LZ processing. The MODEL uses content addressable memory ("CAM") in encoding mode for text storage and character matching, and uses CAM in decoding mode as an on-chip RAM to obtain high speed access.

1 Claim, 9 Drawing Sheets

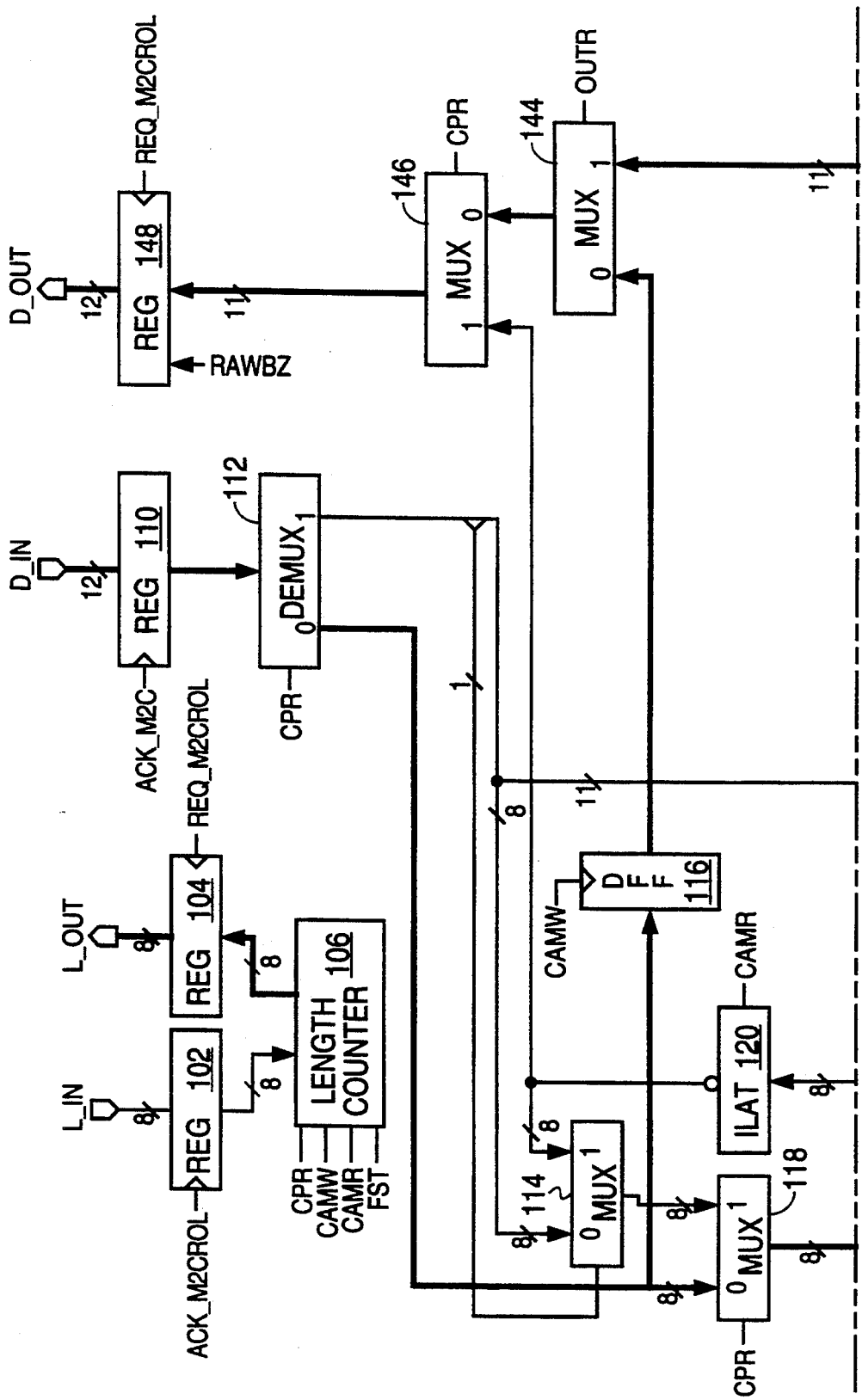

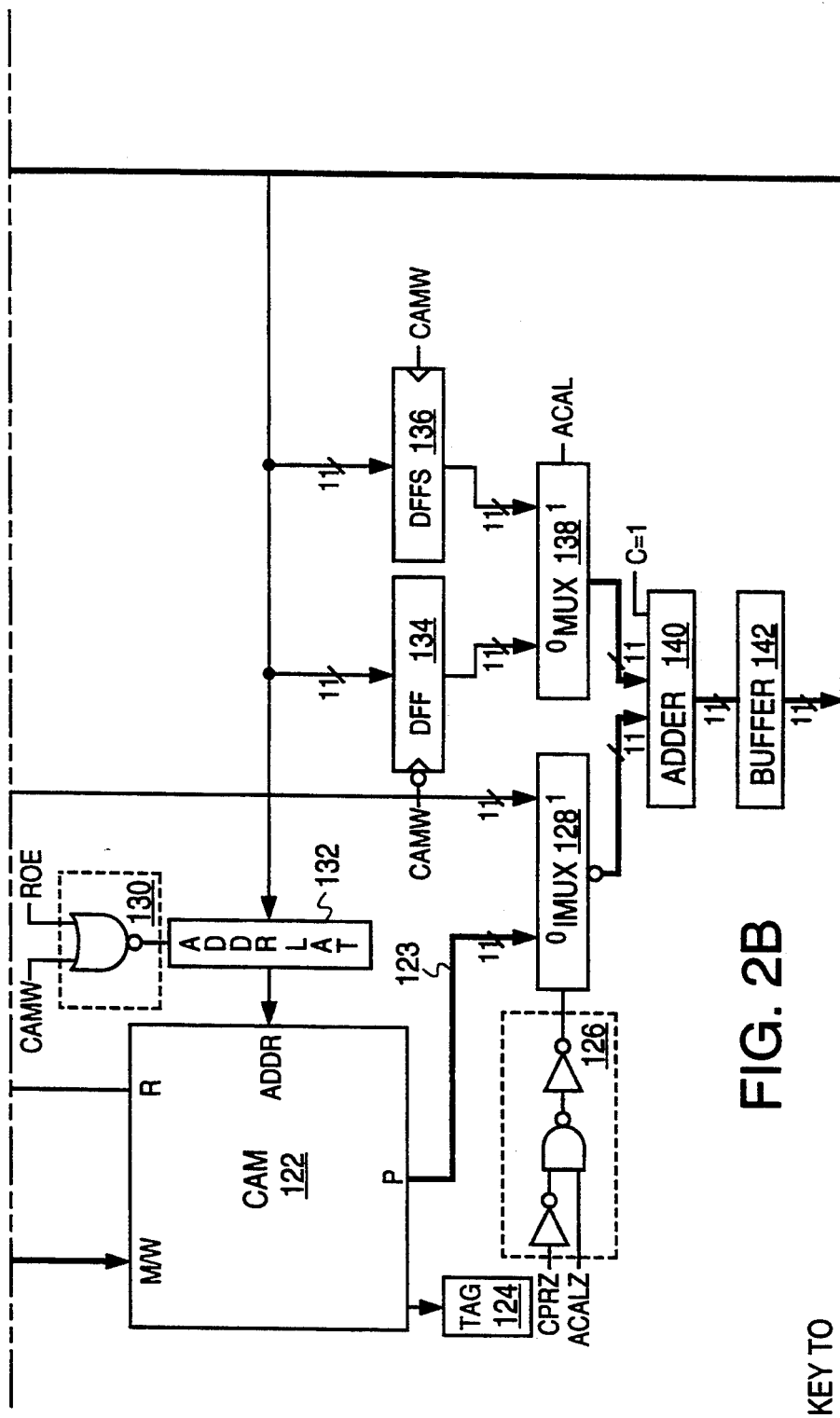

| Step | Text & Address in CAM Memory<br>0 1 2 3 0 1 2 3 0 1 2 3 0 1 2 3 | Match Status | Output |
|---|---|---|---|
| 301 | a a b c a d b a d a a a b a b a<br>= | no match | a |
| 302 | a a b c a d b a d a a a b a b a<br>∧ = | one character | a |
| 303 | a a b c a d b a d a a a b a b a<br>= | no match | b |
| 304 | a a b c a d b a d a a a b a b a<br>= | no match | c |
| 305 | a a b c a d b a d a a a b a b a<br>∧ = = | one character | a |
| 306 | a a b c a d b a d a a a b a b a<br>= = | no match | d |
| 307 | a a b c a d b a d a a a b a b a<br>∧ = = | one character | b |

FIG. 6A

| Step | Text & Address in CAM Memory<br>0 1 2 3 0 1 2 3 0 1 2 3 0 1 2 3 | Match Status | Output |
|---|---|---|---|
| 308 | a a b c a d b a d a a b a b a | plural characters | <3,2> |
| 309 | a a b c a d b a d a a b a b a | one character | a |
| 310 | a a b c a d b a d a a b a b a | one character | a |
| 311 | a a b c a d b a d a a b a b a | no match | b |
| 312 | a a b c a d b a d a a b a b a c | plural characters | <2,3> |

FIG. 6B

DATA COMPRESSION USING CONTENT ADDRESSABLE MEMORY

BACKGROUND OF THE INVENTION

1. Field of the Invention

The invention pertains to data compression, and more particularly to apparatus and methods for lossless data compression.

2. Background of the Invention

Dictionary coding is a class of compression techniques characterized by the replacement of groups of consecutive characters, or "phrases," occurring in the data, or "text," with indexes into some dictionary. The selection of entries for the coding dictionary is an important consideration in the design of a dictionary scheme, and the choice of phrases may be made staticly, semiadaptively, or adaptively. A particularly useful class of compression methods based on an adaptive scheme is known as Ziv-Lempel ("LZ") coding, which essentially involves replacing phrases with a pointer to where they have occurred earlier in the text. Dictionary techniques, including LZ coding, are described in detail in T. C. Bell, J. G. Cleary, and I. H. Witten, Text Compression, Prentice Hall, Englewood Cliffs, N.J., USA, 1990, pp. 206–243, and are incorporated herein by reference.

Dictionary techniques are useful for their speed and economy of memory. Typically, a serial, hashing search method is employed. Unfortunately, in some applications even dictionary techniques implemented with a serial hashing search method are not as fast as desired.

SUMMARY OF THE INVENTION

The present invention is capable of achieving fast compression speed and a high compression ratio by using a content addressable memory to search for redundancies in a text.

In one embodiment of the invention, a method for compressing text, portions of the text are progressively stored in addressable locations of content addressable memory ("CAM") and an input character from the text following the portion of the text stored in the CAM is progressively compared with the portion of the text stored in the CAM until a match fail results. A length value is determined by counting the number of matches until the match fail results. An offset value is determined in accordance with the location of a character in the matched phrase with the location of a corresponding character in the matching phrase. The offset and length are furnished as compressed output.

Another embodiment of the invention, an apparatus for compressing text, comprises a content addressable memory ("CAM") for progressively storing portions of the text in addressable locations of the CAM and progressively comparing an input character from the text following the portion of the text stored in the CAM with the portion of the text stored in the CAM until a match fail results. The CAM has a pointer output for furnishing upon match fail a first address in the CA34 of a character in the matching phrase. A length counter is responsive to match events in the CAM for counting the number of matches until the match fail results. A register is provided for storing a second address relative to the CAM of a character in a matched phrase corresponding to the character in the matching phrase having its address furnished by the CAM. An adder receives the output of the pointer and the output of the register for determining an offset value in accordance with the first and second addresses.

Another embodiment of the invention, a compare bit for use in association with a byte of content addressable memory cells in a content addressable memory ("CAM") comprising a plurality of CAM bytes, comprises a first latch element having an input connected to a match line input from the associated CAM byte. A switch controllably opened and closed by a NXT signal from a preceding compare bit in the CAM is connected to the match input line for controllably forcing the first latch element into a match fail state. A pass gate is connected to the output of the first latch element, and a second latch element has its input connected to the output of the pass gate. A NXT signal for a following compare bit is derived from the output of the second latch element.

BRIEF DESCRIPTION OF THE FIGURES

FIGS. 2A and 2B and 3A and 3B are block-level schematic diagrams of a content addressable memory based architecture for implementing LZ coding. The data path used in encoding is emphasized in FIGS. 2A and B. The data path used in decoding is emphasized in FIGS. 3A and B.

FIGS. 6A and 6B are a list of a text, or input character string, showing in a conceptual sense the location of a sliding window, the relationship at various points in the LZ coding between a matched phrase and a matching phrase in the sliding window, and the compressed output at various points in the LZ coding.

DETAILED DESCRIPTION OF THE PREFERRED EMBODIMENT

Figure 1:
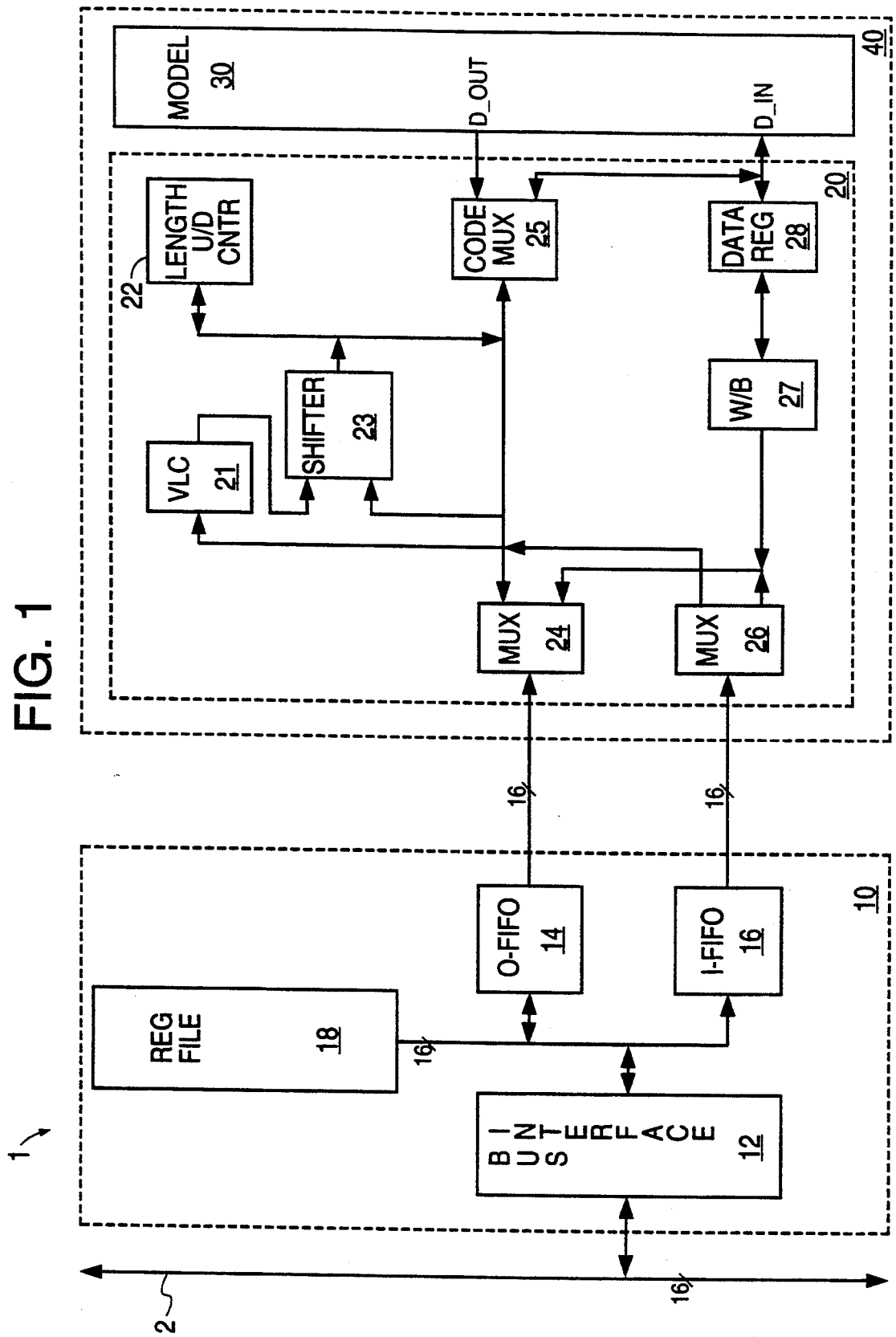
FIG. 1 is a block-level schematic diagram of a data compression/decompression processor.

The data compression/decompression processor 1 illustrated in FIG. 1 implements a modified Ziv-Lempel ("LZ") coding technique. The processor 1 includes three modules, an interface 10, a coder-decoder ("CODEC") 20, and a MODEL 30. The CODEC 20 and the MODEL 30 together form compression engine 40. The modules 10, 20 and 30 typically run concurrently.

The interface 10 handles communications with the host bus 2 and the handshake protocol to the CODEC 20. The interface 10 includes a bus interface 12, which is designed in accordance with the host or hosts with which the processor 1 operates. Where, for example, the host is a model PC-AT (Trademark) personal computer such as available from International Business Machines Incorporated, Armonk, N.Y., the bus interface 12 implements a compatible 16 bit bus interface, and includes 16 bit wide internal buses and registers. The internal registers 18 provide chip status and configuration updates, and receive control and command signals from the host. So that the interface may operate at a different clock rate than the MODEL to optimize data flow, first-in-first-out ("FIFO") registers 14 and 16, output and input registers respectively, are included for input and output rate buffers.

The CODEC 20 operates in either compression or decompression mode. In compression mode, the CODEC 20 receives data in the form of characters from input FIFO 16 of the interface 10, and routes them to the data input D_IN terminal of the MODEL 30 through multiplexer 26, write back buffer 27, and data register 28 for LZ processing. The CODEC 20 receives LZ processed data, which may be raw bytes or LZ encoded data, from the MODEL 30, and further encodes the LZ processed data using variable length coding ("VLC") in VLC circuit 21, shifter 23, and length up/down counter 22 using any suitable technique, including well-known conventional techniques. The data is further packed into 16 bit words and routed to the output FIFO 14 in the interface 10 through multiplexer 24. In decompression mode, the CODEC 20 receives compressed data, unpacks and VLC-decodes the data in the VLC circuit 21, the shifter 23, and the length up/down counter 22 using any suitable technique, including well-known conventional techniques. The unpacked VLC-decoded data is routed to the data input D_IN terminal of the MODEL 30 through multiplexer 25 for LZ decoding processing. The CODEC 20 receives LZ decoded data in the form of characters from the data output D-OUT of the MODEL 30, and routes the data to the output FIFO 14 in the interface 10 through data register 28, write-back buffer 27, and multiplexer 24.

The MODEL 30 implements the LZ processing. As used herein to explain LZ processing, the term "text" refers to any collection of "characters," wherein a character is a representation of any n-bit value, whether alphanumeric, graphical, a control value, or any other value. In one type of LZ compression processing referred to herein as LZ1 processing, phrases are replaced with pointers to where they occur earlier in the text. A phrase might be a data word or several data words. A pointer is a pair <O,L> that represents a phrase of length "L," referred to herein as the "matched" phrase, having a "matching" phrase that starts at a position within the sliding window having an offset "O" from the current position. The maximum offset value defines the size of a sliding window on the text. If a character does not appear in the sliding window, it is considered to be a raw byte and is encoded as the character itself. In the particular version of LZ1 processing described below, a phrase of a single character is encoded as raw data in preference to the <O,L> coding, since in this version, no compression would be realized if the <O,L> coding were used. In another type of LZ compression processing referred to herein as LZ2 processing, the text seen so far is parsed into phrases, each phrase being the longest matching phrase seen previously plus one character. Each phrase is encoded as an index to its previous longest matching phrase, plus the extra character. The new phrase is added to the list of phrases in the dictionary.

Figure 3A:
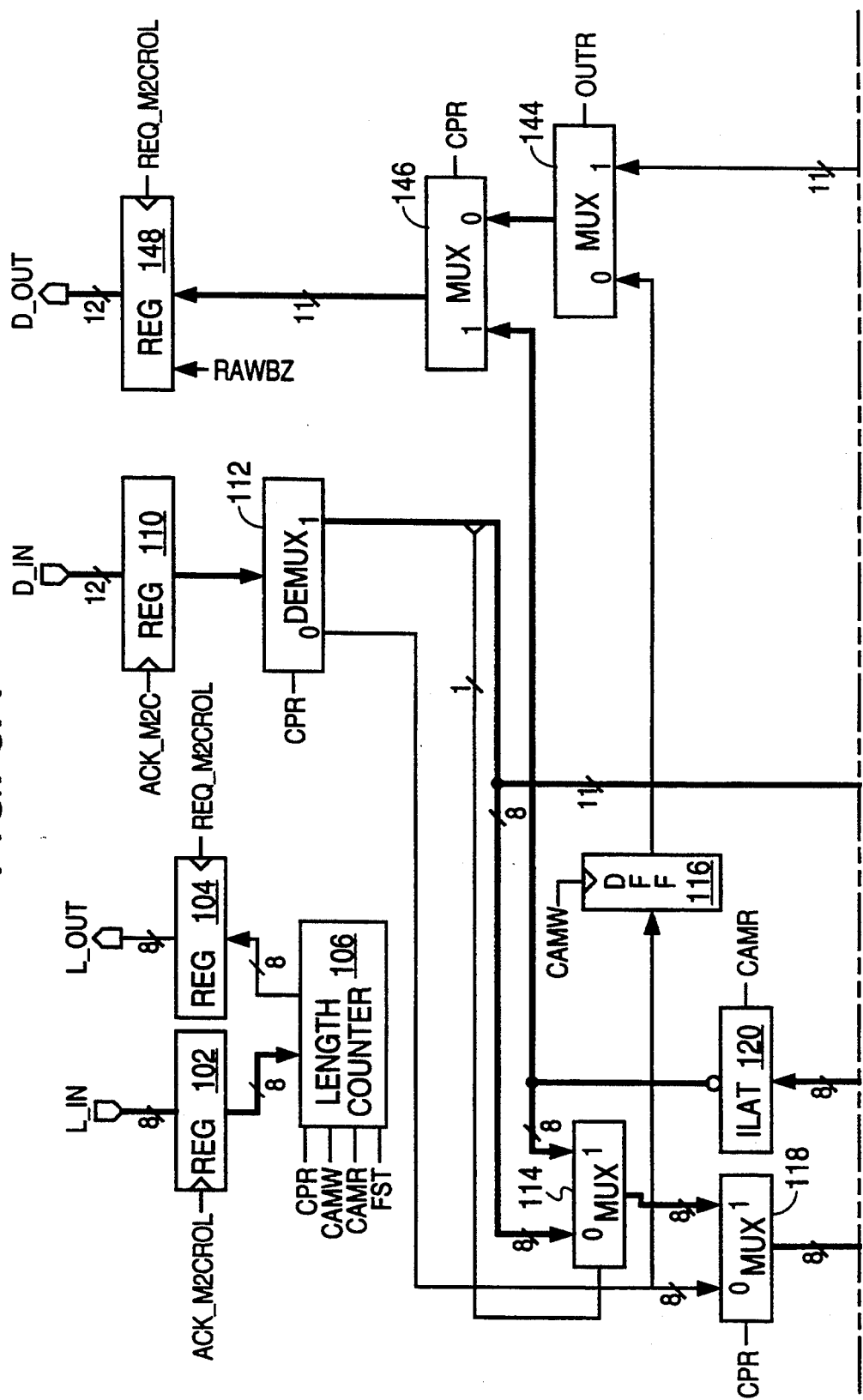
Figure 3B:
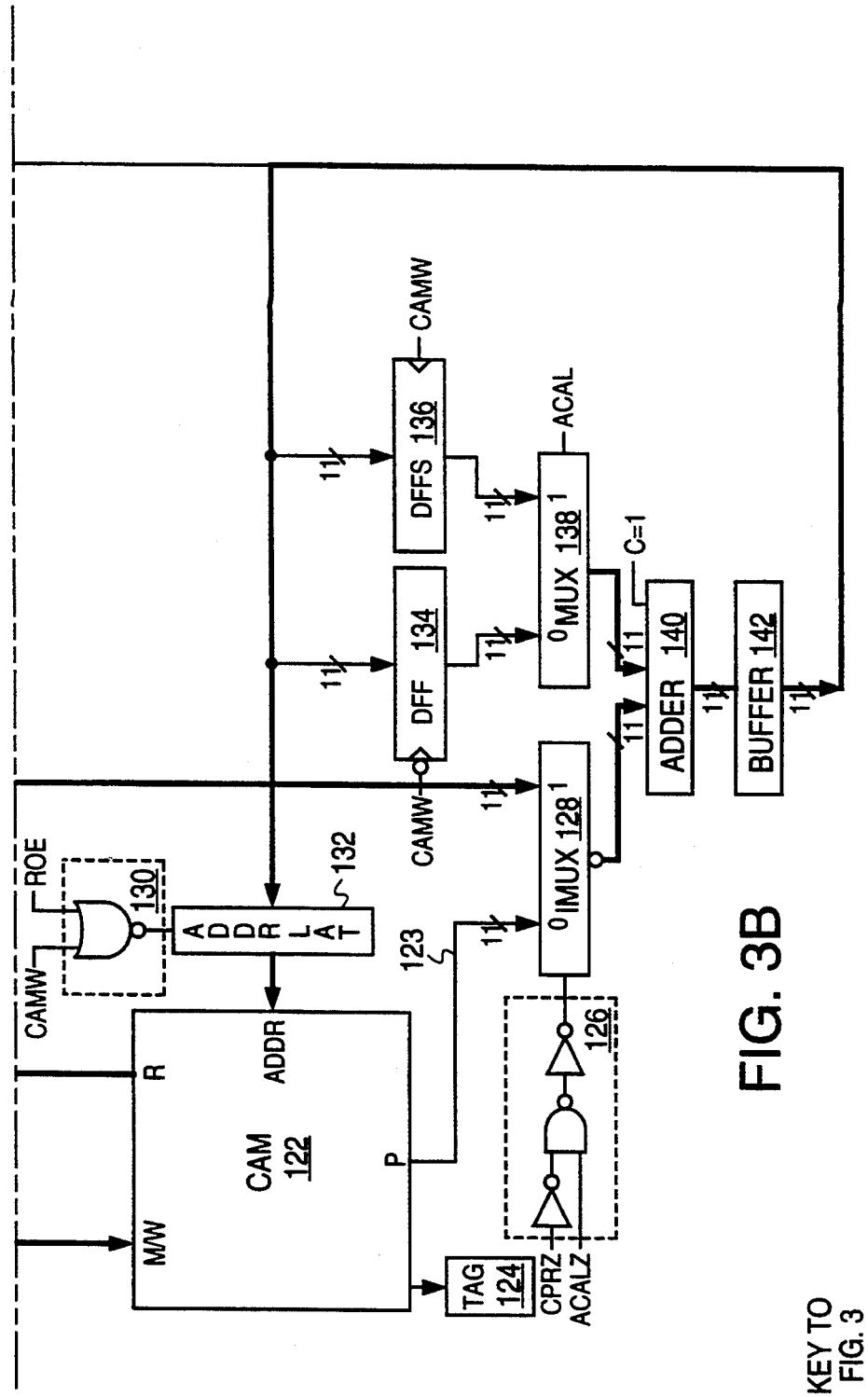

An illustrative content addressable memory ("CAM") implementation of the MODEL 30 particularly suitable for LZ1 processing is shown in FIGS. 2A and 2B and 3A and 3B, in which the encoding data path is emphasized in FIGS. 2A and 2B and the decoding data path is emphasized in FIGS. 3A and 3B. The implementation of FIGS. 2A and 2B and 3A and 3B uses content addressable memory to implement the sliding window used in LZ1 processing for text storage and phrase matching. During encoding, matching of a character with all previous characters in the window is done in parallel in one clock cycle in CAM 122, so that the search for the longest match is done quickly and exhaustively, without the need for external memory. During decoding, the CAM 122 is used as an on-chip RAM to obtain high speed access.

Figure 4:
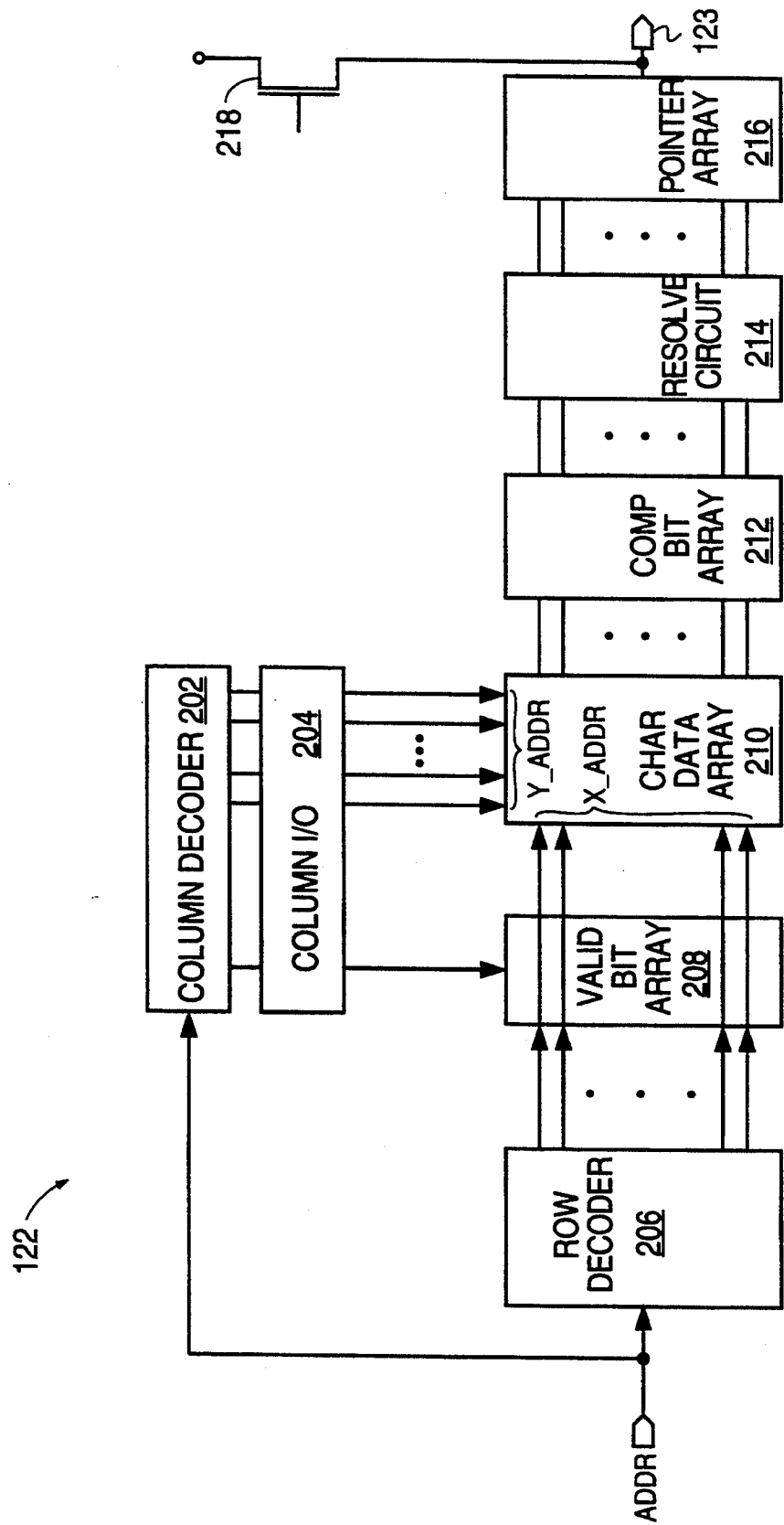
FIG. 4 is a block-level schematic diagram of a content addressable memory.

An illustrative configuration for the CAM 122 is shown in FIG. 4. The CAM 122 includes suitable row and column decoders 206 and 202, a column I/O circuit 204 including suitable sense amps, write buffers, and precharge circuits, a CAM cell array having a VALID bit section 208 for storing valid bits and a character data array 210 for storing character bytes, a compare or COMP bit array 212 for indicating match conditions, a resolve circuit 214 for resolving priority among multiple matches in the CAM 122 in order to select a pointer, a pointer array 216 for storing pointers, and a pointer output 123 for the match address. Pull up transistors 218 are provided to pull up pointer output line 123 prior to each compare operation.

The CAM 122 may be configured as desired. For example, in one configuration the CAM 122 comprises 2048 words of 9 bits each. The first CAM bit of a word is a VALID bit for indicating valid data, the next eight CAM bits of a word are for storing a byte of character data, and the last bit of a word is a COMP bit for indicating a match and for selectively enabling or disabling a comparison with data in the next address. The CAM cells of the valid bit array 208 and the character data array 210 may be any suitable type, including the circuits disclosed in a concurrently filed and commonly assigned application by Ching-Lin Jiang entitled "Content Addressable Memory," application Ser. No. 07/874,489, which are incorporated herein by reference.

Figure 5:
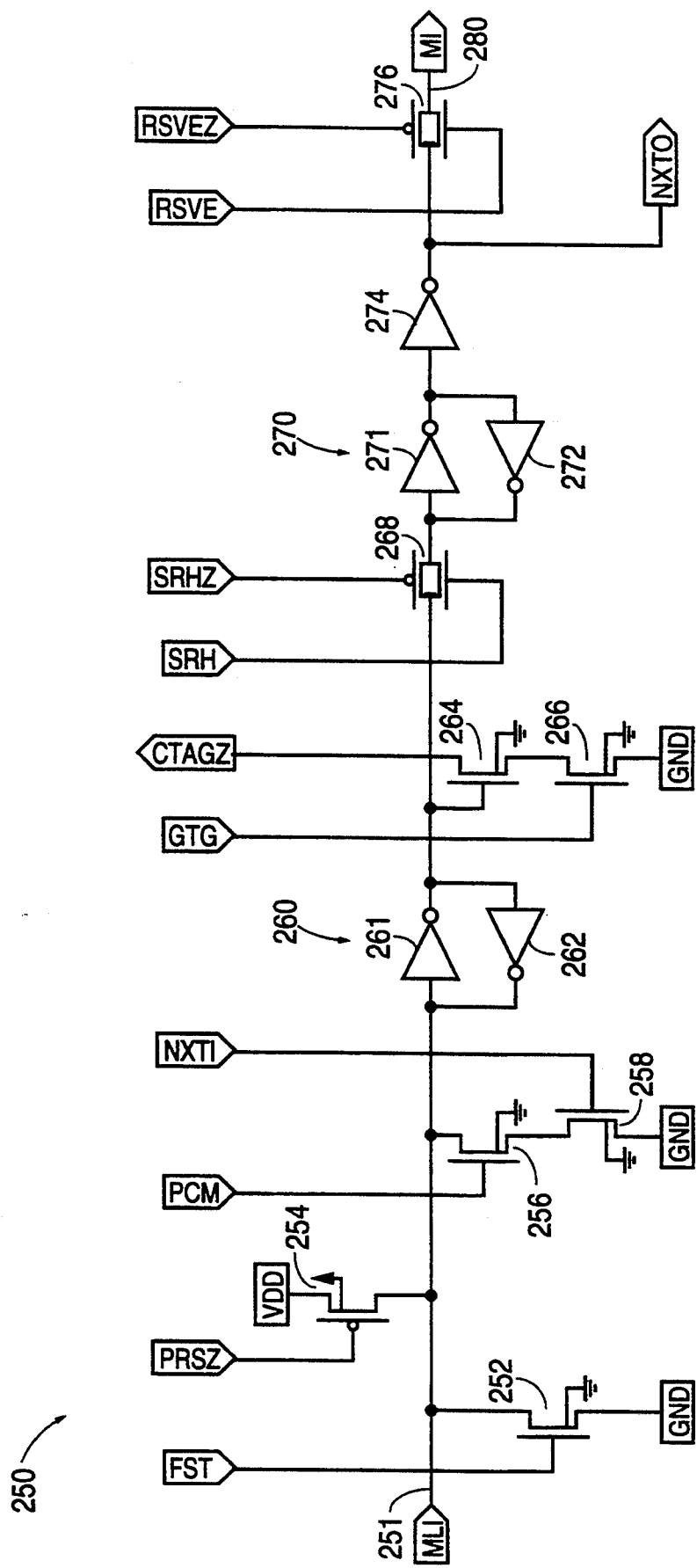
FIG. 5 is a transistor-level schematic diagram of a compare bit for the content addressable memory of FIG. 4.

A suitable illustrative COMP bit 250 is shown in FIG. 5. The COMP bit 250 includes cross-coupled inverters 261 and 262 forming a first latch element 260, and cross-coupled inverters 271 and 272 forming a second latch element 270. Line 251 is a match line input ("MLI") to the COMP bit 250 from a byte of content addressable memory cells. MLI line 251 is normally discharged to a logic 0 before a comparison operation is done, and either remains discharged at logic 0 should a match occurs, or is charged to logic 1 when a match fail occurs.

Two circuit branches prepare the COMP bit 250 for a comparison operation by ensuring that MLI line 251 is discharged. One branch comprises n-channel transistor 252, which is controlled by first signal FST. Signal FST is asserted before the first bit beginning each new phrase, to ensure that all COMP bits of the content addressable memory are brought into compare mode. The second branch comprises series connected n-channel transistors 256 and 258, which are controlled by predischarge mode signal PCM and next tag input signal NXTI. The PCM signal, which is applied to gate of transistor 256, is asserted high at the beginning of every character comparison to turn on transistor 256 and allow signal NXTI to control whether the COMP bit 250 enters compare mode. Signal NXTI is applied to the gate of transistor 258, and is obtained from the immediately preceding COMP bit of the content addressable memory; the corresponding node is illustrated in COMP bit 250 as signal NXTO, which is the output of the second latch element 270 obtained through inverter 274. Signal NXTI is logic 1 when a match occurred in the immediately preceding COMP bit of the content addressable memory, and ensures that the COMP bit 250 enters compare mode. Otherwise, signal NXTI is logic 0.

One circuit branch is asserted after a comparison operation to ensure that should a match have occurred during the comparison, the line MLI is charged to logic 1, or a match fail condition, to avoid a vestigial match indication in the next comparison operation. The complement of a precharge setup signal PRS is applied to the gate of p-channel 254 after each comparison operation, and charges MLI line 251 to logic 1, a match fail condition.

Latching is controlled by shift-right signal SRH and its complement SRHZ, which are applied to pass gate 268 comprising an n-channel transistor and a p-channel transistor. Reading of the latched value is controlled by resolve signal RSVE and its complement RSVEZ, which are applied to pass gate 276 comprising an n-channel transistor and a p-channel transistor.

The COMP bit of FIG. 5 functions as follows. At the beginning of each new phrase of the text, signal FST is asserted high to cause transistor 252 to discharge MLI line 251. If a match occurs, the MLI line 251 remains discharged and the first latch remains at logic 1. If a match fail occurs, the MLI line 251 is precharged and the first latch is at logic 0.

Next, signal GTG is asserted high to determine whether any byte of COMP bits in the content addressable memory have recorded a match condition. Since in a match condition the MLI line 251 is discharged and the output of latch element 260 is high (logic 1), signal CTAGZ is forced, or discharged, to a logic 0. If no match occurs in the content addressable memory, signal CTAGZ remains at logic 1. Hence, true signal CTAG is logic 1 when a match occurs, and logic 0 when no match occurs.

In the event of a match fail throughout the content addressable memory (signal CTAG at logic 0), signal SRH is not asserted and the state of the second latch element 270 is not disturbed. Signal RSVE is asserted to place the value stored in the second latch element 270 on the MI line 280, for application to the resolve circuit 214. MI line 280 is logic 1 for a match, and logic 0 for a match fail.

In the event of a match at some address of the content addressable memory (signal CTAG at logic 1), signal RSVE is not asserted. Signal SRH is asserted, so that the logic 1 at the output of the first latch element 260 drives the second latch element 270 to logic 0. The output of the second latch element 270 is inverted by inverter 274, and the logic 1 output of the inverter 274 is available to drive the resolve circuit 214 and the signal NXTO. Signal NXTO is applied as signal NXTI to the next COMP bit of the content addressable memory, in preparation for the next compare operation.

FIGS. 2A and 2B show an illustrative CAM implementation of the MODEL 30 in which the data path participating in LZ1 encoding is emphasized. A counter 106 is initialized to zero at the start of each phrase compare operation, and accumulates the length "L" of any matched phrase determined in the operation. The result "L" is written to register 104, which is accessible to the CODEC 20. The input data $D_{13}IN$, which in compression mode is character data, is written by the CODEC 20 into register 110, from which it is routed by demultiplexer 112 and multiplexer 118 to the match/write input of content addressable memory ("CAM") 122, and is applied to delay flipflop 116 for storage upon a write of D_IN to CAM 122. Pointer data from the CAM 122 is selected by inverting multiplexer 128 and routed to adder 140 for address calculations. The output of the adder 140 is applied to buffer 142, and furnished to an input of multiplexer 144 for output purposes. The other input of multiplexer 144 is raw or single character data received from flipflop 116. The multiplexer 144 selects either raw data or <O,L> coded data, and the selected data is routed to output register 148 through multiplexer 146. Register 148 containing the offset data and register 104 containing the length data are accessible to the CODEC 20.

FIGS. 3A and 3B show the same illustrative CAM implementation of the MODEL 30 as in FIGS. 2A and 2B, except that the data path participating in LZ1 decoding is emphasized. If coded data is present, the counter 106 is initialized at the start of each LZ decoding operation by the length "L" of an encoded phrase, which is written into register 102. Register 102 is accessible to the CODEC 20. The input data D_IN, which in decompression mode is raw or coded data, is written by the CODEC 20 into register 110. If the input data D_IN is raw data, the raw data is routed by demultiplexer 112 and multiplexers 114 and 118 to the data input of content addressable memory ("CAM") 122, and written to the CAM 122. The same raw data is read from the CAM 122, and routed through the inverting latch 120 and the multiplexer 146 to the register 148. The raw data is written to register 148 as character data. The character data in register 148 is accessible to the CODEC 20.

If the input data D_IN is offset data, the offset data is routed by demultiplexer 112 and inverting multiplexer 128 to adder 140, where an address of the matching block in the CAM 122 is calculated. The address is stored in buffer 142, and routed to the address latch 132. The matching phrase is read out of the CAM 122 in accordance with the value of "L" stored in register 106, and routed along two paths. One path is used to write back the characters of the matching phrase to the CAM 122 into appropriate locations through multiplexers 114 and 118. The other path is used to furnish the characters of the matching phrase through multiplexer 146 to register 148. The character data in register 148 is accessible to the CODEC 20.

The various control signals for the illustrative CAM implementation of the MODEL 30 are described in Table 1.

TABLE 1

| Abbreviation | Signal Description |
| --- | --- |
| ACAL | Address Calculate. Causes the calculation of a current address for accessing CAM 122 when at logic 1. Causes the calculation of an offset address from an <O,L> code when at logic 0. |
| ACK_M2C | Acknowledge MODEL to CODEC. Follows signal REQ_M2CROL indicating completion of current LZ processing to latch next character from the CODEC 20 during encoding, or next raw character or <O,L> coded data from the CODEC 20 during decoding. |
| ACK_M2CROL | Acknowledge MODEL to CODEC transfer of Raw or Offset-Length data. Follows signal REQ_M2CROL indicating completion of current LZ processing to latch length data, if any, for the next <O,L> coded data from the CODEC 20 during decoding. |
| CPR | Compression. Reset (logic 0) during compression mode. Set (logic 1) during decompression mode. |
| CAMR | Content Addressable Memory Read. Causes a read from the CAM 122. |
| CAMW | Content Addressable Memory Write. Causes a |

TABLE 1-continued

| Abbreviation | Signal Description |
|---|---|
|  | write to the CAM 122 and affects routing. |
| OUTR | Output Route. Selects output source, either raw character or <O,L> data. Signal is in part a function of the contents of the length counter, assuming a logic 0 when the length counter contains a 0 or a 1 value, and assuming a logic 1 when the length counter 106 contains a value of 2 or more. |
| RAWBZ | Raw Bit Complement. Indicates that the associated byte represents a raw character. |
| REQ_M2CROL | Request MODEL to CODEC transfer of Raw or Offset-Length data. Causes raw or <O,L> data to be latched into register 148 for access by the CODEC 20. |
| ROE | Raw Output Enable. Signal is asserted to latch an address calculated from <O,L> data, for reading character data from the CAM 122. |

An example of LZ1 encoding is illustrated in FIG. 6. Steps 301-312 show a text in various steps of processing, in which the single underscore indicates the contents of the sliding window while the double underscore indicates the character of the text being compared with the characters in the sliding window. Where applicable, the matched phrase is indicated in bold print, and the characters in the matching phrase that match characters in the matched phrase are identified by an underlying pointer. For brevity, the sliding window shown in FIG. 4 is assigned a length of 4 characters, although in practice a greater length such as 2048 characters or any other suitable length preferably would be used.

In the first step 301, no sliding window has yet formed, so that the first character "a" of the text has no match in a sliding window. The first character is therefor identified as a raw character and furnished as output. The sliding window is moved to envelop the raw character (see step 302), and is one character in size.

Step 301 is implemented in the architecture of FIG. 2 as follows. Initially, the VALID bits of the CAM 122 are reset to zero to indicate the absence of valid data in the CAM 122. Compression mode is entered by a static assertion low (logic 0) of signal CPR. Signal ACAL is statically asserted high (logic 1) during compression mode to cause the calculation of a current address or offset. Since a new phrase compression operation is beginning, signal FST is asserted and resets the length counter 106. When the first character of the text becomes available, signal ACK_M2C is asserted to write the character "a" from the CODEC 20 to register 110. In accordance with signal CPR, demultiplexer 112 routes the output of register 110 to the match/write port of CAM 122, which is in compare mode. Since the CAM 122 is empty, no match occurs and the tag 124 is set to logic 0. All address bits <10:0> of the pointer output 123 of the CAM 122 remain pulled up. In accordance with signal CPR, multiplexer 128 selects and inverts the output 123, and the resulting binary value of 0 is applied to an input of the adder 140. In other words, when no match occurs, the pointer output 123 of the CAM 122 does not contribute to the address calculation performed in adder 140.

In accordance with signal ACAL, multiplexer 138 selects the output of the set delay flipflop 136 for application to the adder 140. The flipflop 136 is set upon system initialization, and so the eleven bits of the flipflop 136 initially are logic 1. In effect, flipflop 136 holds the last address, to which a carry 1 is added in adder 140 for forming the current address. The current address is buffered in buffer 142. Since the value of 0 contained in the length counter 106 is not 2 or greater, routing signal OUTR is logic 0. In accordance with signal OUTR, multiplexer 144 selects the output of the delay flipflop 116 for routing a raw character through multiplexer 146 to the output register 148.

Next, signal CAMW is asserted to (a) latch the current address from buffer 142 into address latch 132 and write the raw character to the CAM 122 at the current address, which is 0; (b) write the current address into flipflop 136; and (c) write the raw character to flipflop 116, from where it is routed through multiplexers 144 and 146 to the register 148. Although of no consequence because of the match fail condition, the length counter 106 is also advanced by 1. As the tag 124 is logic 0 indicating match fail, signal REQ_M2CROL is asserted to latch the raw character into the register 148.

Note that the register 148 receives 11 bits from multiplexer 146 and one additional bit designated RAWBZ. Signal RAWBZ is assigned one logic state (e.g. a logic 0) when a raw bit is written to the register 148, and another logic state (e.g. a logic 1) when <O,L> encoded data is written to the register 148.

In step 302, the sliding window contains the single character phrase "a". The first character of the text following the sliding window is "a", which is found to match the single character phrase in the sliding window. The sliding window is extended to envelop the matched character, becoming two characters in size. The next character following the sliding window is "b", which does not match any character in the sliding window. Hence, the matched phrase consists of the single character "a". As the matched phrase is only a single character, the matched character is furnished as output in preference to the <O,L> coding.

Step 302 is implemented in the architecture of FIG. 2 as follows. Since a new phrase comparison operation is beginning, signal FST is asserted and resets the length counter 106. In response to signal ACK_M2C, the character "a" from the CODEC 20 is written to register 110. In accordance with signal CPR, demultiplexer 112 to route the output of the register 110 to the match/write port of CAM 122, which is in compare mode. A match is detected at address 0, which sets the COMP bit at address 0 to enable a compare operation at address 1, the next address of the CAM 122, and sets the tag 124 to logic 1. The pointer output 123 of the CAM 122 remains pulled up. In accordance with signal CPR, multiplexer 128 selects and inverts pointer output 123, so that the binary value 0 is applied from the inverting multiplexer 128 to an input of the adder 140. In accordance with signal ACAL, multiplexer 138 selects the output of the flipflop 136 for application to the adder 140. The flipflop 136 contains the last address of 0, to which a carry 1 is added in adder 140 for forming the current address of 1. The current address is buffered in buffer 142. Since the value of 0 contained in the length counter 106 is not two or greater, output routing signal OUTR remains 0 to select the output of the delay flipflop 116 for routing a raw character through multiplexer 146 to the output register 148. Then, signal CAMW is asserted to (a) latch the current address of 1 from buffer 142 into address latch 132 and write the raw character "a" to the CAM 122 at the current address 1; (b) write the current address into flipflop 136; (c) write the raw character to flipflop 116, from where it is routed through multiplexers 144 and 146 to the register 148; and (d) advance the length counter 106 from 0 to 1. Since tag 124 is logic 1 indicating a match, signal REQ_M2CROL is not asserted and the raw character "a" is not written into the register 148.

Step 302 continues with another assertion of signal ACK_M2C, which causes the next character "b" from the CODEC 20 to be written to register 110. In accordance with signal CPR, demultiplexer 112 routes the output of the register 110 to the match/write port of CAM 122, which is in compare mode. As address 2, the only word enabled for matching, does not contain a set valid bit (only addresses 0 and 1 contain set valid bits), a match fail condition results and the tag 124 is logic 0. The address of the last matching character is driven onto the pointer output 123 of the CAM 122. However, this is of no consequence, since the 0 input of multiplexer 144 remains selected. This is because the value of the length counter 106 is only 1, so that the value of signal OUTR remains 0. Signal CAMW is not asserted since a match fail condition occurred within a phrase. Since tag 124 is set to logic 0 indicating a match fail, signal REQ_M2CROL is asserted and the raw character "a" stored in flipflop 116 is written into the register 148 through multiplexers 144 and 146.

In step 303, the sliding window contains the phrase "aa". The first character in the text following the sliding window is "b", which has no match in the sliding window. The character "b" is therefor identified as a raw character and furnished as output. The sliding window is moved to envelop the raw character (see step 304), and is now three characters in size.

Step 303 is implemented in the architecture of FIG. 2 as follows. Since a new phrase comparison operation is beginning, signal FST is asserted and resets the length counter 106. Signal ACK_M2C is not asserted since the next character of the text "b" is already resident in register 110 due to the match fail in step 302. Tag 124 is logic 0. All address bits <10:0> of the pointer output 123 of the CAM 122 remain pulled up. In accordance with signal CPR, multiplexer 128 selects and inverts pointer output 123, so that the binary value 0 is applied from the inverting multiplexer 128 to an input of the adder 140. In accordance with signal ACAL, multiplexer 138 selects the output of the flipflop 136 for application to the adder 140. The flipflop 136 contains the last address of 1, to which a carry 1 is added in adder 140 for forming the current address 2. The current address is buffered in buffer 142. Since the value of 0 contained in the length counter 106 is not two or greater, output routing signal OUTR remains 0 to select the output of the delay flipflop 116 for routing a raw character through multiplexer 146 to the output register 148. Then, signal CAMW is asserted to (a) latch the current address of 2 from buffer 142 into address latch 132 and write the raw character "b" to the CAM 122 at the current address 2; (b) write the current address into flipflop 136; and (c) write the raw character to flipflop 116, from where it is routed through multiplexers 144 and 146 to the register 148. Although of no consequence because of the match fail condition, the length counter 106 is also advanced by one. As the tag 124 is set at logic 0 indicating match fail, signal REQ_M2CROL is asserted to latch the raw character into the register 148.

In step 304, the sliding window contains the phrase "aab". The first character of the text following the sliding window is "c", which has no match in the sliding window. The character "c" is therefor identified as a raw character and furnished as output. The sliding window is moved to envelop the raw character (see step 305), and has grown to its full length of four characters.

Step 304 is implemented in the architecture of FIG. 2 as follows. Since a new phrase comparison operation is beginning, signal FST is asserted and resets the length counter 106. In response to signal ACK_M2C, the character "c" from the CODEC 20 is written to register 110. In accordance with signal CPR, demultiplexer 112 and multiplexer 118 route the output of register 110 to the match/write port of CAM 122, which is in compare mode. A match fail results, so that the tag 124 is set to logic 0 and the pointer bus 123 from the CAM 122 remains pulled up. The pointer bus 123 contributes through inverting multiplexer 128 a 0 binary value to adder 140, which determines the current address from the output of flipflop 136. The current address is buffered in buffer 142. Since the value of 0 contained in the length counter 106 is not 2 or greater, routing signal OUTR is logic 0 and selects the output of the delay flipflop 116 for routing a raw character through multiplexer 146 to the output register 148. Then, signal CAMW is asserted to (a) latch the current address from buffer 142 into address latch 132 and write the raw character to the CAM 122 at the current address, which is 3; (b) write the current address into flipflop 136; and (c) write the raw character to flipflop 116, from where it is routed through multiplexers 144 and 146 to the register 148. Although of no consequence because of the match fail condition, the length counter 106 is also advanced by 1. As the tag 124 is set at logic 0 indicating match fail, signal REQ_M2CROL is asserted to latch the raw character into the register 148.

In step 305, the sliding window contains the phrase "aabc". The character of the text following the sliding window is "a", which matches two matching characters, the first and second characters, in the sliding window. The sliding window is moved. The character now following the sliding window is "d", which does not match either of the characters following the matching characters. Hence, the matched phrase consists of the single character "a". As the matched phrase is only a single character, the matched character is furnished as output in preference to the <O,L> coding.

The implementation of step 305 in the architecture of FIG. 2 is similar to the implementation of step 302. Since a new phrase comparison operation is beginning, signal FST is asserted and resets the length counter 106. Signal ACK_M2C is asserted to write the character "a" to register 110, from which the character is routed by demultiplexer 112 and multiplexer 118 to the match/write port of CAM 122, which is in compare mode. Matches are detected at addresses 0 and 1, which sets the COMP bits at addresses 0 and 1 to logic 1 to enable compare operations at addresses 1 and 2, and sets the tag 124 to logic 1. The pointer output 118 of the CAM 122 contributes through the 0 input of the inverting multiplexer 128 the binary value 0 to an input of the adder 140. In accordance with signal ACAL, multiplexer 138 selects the output of the flipflop 136 for application to the adder 140. The flipflop 136 contains the last address of 3, to which a carry 1 is added in adder 140 for forming the current address of 0. The current address is buffered in buffer 142. Since the value of 0 contained in the length counter 106 is not two or greater, output routing signal OUTR remains 0 to select the output of the delay flipflop 116 for routing a raw character through multiplexer 146 to the output register 148. Then, signal CAMW is asserted to (a) latch the current address of 0 from buffer 142 into address latch 132 and write the raw character "a" to the CAM 122 at the current address; (b) write the current address into flipflop 136; (c) write the raw character to flipflop 116, from where it is routed through multiplexers 144 and 146 to the register 148; and (d) advance the length counter 106 from 0 to 1. Since tag 124 is logic 1 indicating a match, signal REQ_M2CROL is not asserted and the raw character "a" is not written into the register 148. Note that the CAM 122 is full, and that the address has cycled so that the writing of the matched character overwrites the previously longest memory-resident character.

Step 305 continues with another assertion of signal ACK_M2C, which causes the next character "d" to be written to register 110. The output of the register 110 is routed by demultiplexer 112 and multiplexer 118 to the match/write port of CAM 122, which is in compare mode. As addresses 1 and 2, the only addresses enabled for matching, do not contain a "b" a match fail condition results and the tag 124 is reset to logic 0. The resolve circuit 214 (FIG. 4) senses that matches last occurred at addresses 0 and 1, resolves the multiple matches by selecting one of the addresses (e.g. address 1) in accordance with a pre-established criteria (e.g. minimize offset), and causes the pointer array 216 to drive address 1 onto the pointer output 123 of the CAM 122. However, this is of no consequence, since signal OUTR remains logic 0 because the value of the length counter 106 is only 1, and in accordance with signal OUTR the multiplexer 144 selects the output of the flipflop 116. Signal CAMW is not asserted since a match fail condition occurred within a phrase. Since tag 124 is logic 0 indicating a match fail, signal REQ_M2CROL is asserted and the raw character "a" stored in flipflop 116 is written into the register 148 through multiplexers 144 and 146.

In step 306, the sliding window contains the phrase "abca". The first character of the text following the sliding window is "d", which has no match in the sliding window. The character "d" is therefor identified as a raw character and furnished as output. The sliding window is moved to envelop the raw character (see step 307).

Step 306 is implemented in the architecture of FIG. 2 in a manner similar to step 303, as follows. Since a new phrase comparison operation is beginning, signal FST is asserted and resets the length counter 106. Signal ACK_M2C is not asserted since the next character of the text "d" is already resident in register 110 due to the match fail in step 302. Tag 124 is reset to logic 0. The pointer output 123 of the CAM 122 contributes through the 0 input of the inverting multiplexer 128 the binary value 0 to an input of the adder 140, while multiplexer 138 selects the output of the flipflop 136 for application to the adder 140. The flipflop 136 contains the last address of 0, to which a carry 1 is added in adder 140 for forming the current address of 1. The current address is buffered in buffer 142. Since the value of 0 contained in the length counter 106 is not two or greater, output routing signal OUTR remains 0 to select the output of the delay flipflop 116 for routing a raw character through multiplexer 146 to the output register 148. Then, signal CAMW is asserted to (a) latch the current address of 1 from buffer 142 into address latch 132 and write the raw character "d" to the CAM 122 at the current address; (b) write the current address into flipflop 136; and (c) write the raw character to flipflop 116, from where it is routed through multiplexers 144 and 146 to the register 148. Although of no consequence because of the match fail condition, the length counter 106 is also advanced by one. As the tag 124 is logic 0 indicating a match fail, signal REQ_M2CROL is asserted to latch the raw character into the register 148.

In step 307, the sliding window contains the phrase "bcad". The first character of the text following the sliding window is "b", which matches a matching character, the first character, in the sliding window. The sliding window is moved. The next character "a" of the text does not match the character "c" that follows the matching character in the sliding window, so the matched phrase consists of the single character "b". As the matched phrase has only a single character, the matched character is furnished as output in preference to the <O,L> coding.

Step 307 is implemented in the architecture of FIG. 2 in a manner similar to step 305, as follows. Since a new phrase comparison operation is beginning, signal FST is asserted and resets the length counter 106. Signal ACK_M2C is asserted to write the character "b" to register 110, from which the character is routed by demultiplexer 112 and multiplexer 118 to the match/write port of CAM 122, which is in compare mode. A match is detected at address 2, which sets the COMP bits at address 2 to enable a compare operation at address 3, and sets the tag 124 to logic 1. In accordance with signal ACAL, multiplexer 138 selects the output of the flipflop 136 for application to the adder 140. The pointer output 118 of the CAM 122 contributes through the 0 input of the inverting multiplexer 128 the binary value 0 to an input of the adder 140. The flipflop 136 contains the last address of 1, to which a carry 1 is added in adder 140 for forming the current address of 2. The current address is buffered in buffer 142. Since the value of 0 contained in the length counter 106 is not two or greater, output routing signal OUTR remains 0 to select the output of the delay flipflop 116 for routing a raw character through multiplexer 146 to the output register 148. Then, signal CAMW is asserted to (a) latch the current address of 2 from buffer 142 into address latch 132 and write the raw character "b" to the CAM 122 at the current address; (b) write the current address into flipflop 136; (c) write the raw character to flipflop 116, from where it is routed through multiplexers 144 and 146 to the register 148; and (d) advance the length counter 106 from 0 to 1. Since tag 124 is logic 1 indicating a match, signal REQ_M2CROL is not asserted and the raw character "a" is not written into the register 148.

Step 307 continues with another assertion of signal ACK_M2C, which causes the next character "a" to be written to register 110. The output of the register 110 is routed by demultiplexer 112 and multiplexer 118 to the match/write port of CAM 122, which is in compare mode. As address 3, the only address enabled for matching, does not contain a "b" a match fail condition is detected and the tag 124 is reset to logic 0. Address 2 is driven onto the pointer output 123 of the CAM 122. However, this is of no consequence, since the 0 input of multiplexer 144 remains selected by signal OUTR since the value of the length counter 106 is only 1. Signal CAMW is not asserted since a match fail condition occurred within a phrase. Since tag 124 is logic 0 indicating a match fail, signal REQ_M2CROL is asserted and the raw character "b" stored in flipflop 116 is written into the register 148 through multiplexers 144 and 146.

In step 308, the sliding window contains the phrase "cadb". The first character of the text following the sliding window is "a", which matches a matching character, the second character, in the sliding window. The sliding window is moved. The character "d" now following the sliding window matches the character following the first matching character in the sliding window. The sliding window is again moved. The next character "a" now following the sliding window does not match the character following the second matching character in the sliding window. Hence, the matched phrase is "ad", which has a length of two characters and corresponds to a matching phrase offset of three characters. The code <3,2> is furnished as output.

Step 308 is implemented in the architecture of FIG. 2 as follows. Since a new phrase comparison operation is beginning, signal FST is asserted and resets the length counter 106. Signal ACK_M2C is not asserted since the next character of the text "d" is already resident in register 110 due to the match fail within a phrase in step 307. In accordance with signal CPR, the character is routed by demultiplexer 112 and multiplexer 118 to the match/write port of CAM 122, which is in compare mode. A match is detected at address 0, which sets the COMP bits at address 0 to enable a compare operation at address 1, and sets the tag 124 to logic 1. In accordance with signal ACAL, multiplexer 138 selects the output of the flipflop 136 for application to the adder 140. The pointer output 118 of the CAM 122 contributes through the 0 input of the inverting multiplexer 128 the binary value 0 to an input of the adder 140. The flipflop 136 contains the last address of 2, to which a carry 1 is added in adder 140 for forming the current address of 3. The current address is buffered in buffer 142. Since the value of 0 contained in the length counter 106 is not two or greater, output routing signal OUTR remains 0 to select the output of the delay flipflop 116 for routing a raw character through multiplexer 146 to the output register 148. Then, signal CAMW is asserted to (a) latch the current address of 3 from buffer 142 into address latch 132 and write the raw character "a" to the CAM 122 at the current address; (b) write the current address into flipflop 136; (c) write the raw character to flipflop 116, from where it is routed through multiplexers 144 and 146 to the register 148; and (d) advance the length counter 106 from 0 to 1. Since tag 124 is logic 1 indicating a match, signal REQ_M2CROL is not asserted and the raw character "a" is not written into the register 148.

Step 308 continues with an assertion of signal ACK_M2C, which causes the next character "d" to be written to register 110. The output of the register 110 is routed by demultiplexer 112 and multiplexer 118 to the match/write port of CAM 122, which is in compare mode. A match is detected at address 1, the only address enabled for matching, which sets the COMP bits at address 1 to enable a compare operation at address 2. The tag 124 remains at logic 1. In accordance with signal ACAL, multiplexer 138 selects the output of the flipflop 136 for application to the adder 140. The pointer output 123 of the CAM 122 contributes through the 0 input of the inverting multiplexer 128 the binary value 0 to an input of the adder 140. The flipflop 136 contains the last address of 3, to which a carry 1 is added in adder 140 for forming the current address of 0. The current address is buffered in buffer 142. Since the value of 1 contained in the length counter 106 is not two or greater, output routing signal OUTR remains 0 to select the output of the delay flipflop 116 for routing a raw character through multiplexer 146 to the output register 148. Then, signal CAMW is asserted to (a) latch the current address of 0 from buffer 142 into address latch 132 and write the raw character "d" to the CAM 122 at the current address; (b) write the current address into flipflop 136; (c) write the raw character to flipflop 116, from where it is routed through multiplexers 144 and 146 to the register 148; and (d) advance the length counter 106 from 1 to 2. Since tag 124 is logic 1 indicating a match, signal REQ_M2CROL is not asserted and the raw character "d" is not written into the register 148.

Step 308 continues with another assertion of signal ACK_M2C, which causes the next character "a" to be written to register 110. The output of the register 110 is routed by demultiplexer 112 and multiplexer 118 to the match/write port of CAM 122, which is in compare mode. As address 2, the only address enabled for matching, does not contain an "a", a match fail condition is detected and the tag 124 is reset to logic 0. Signal CAMW is not asserted since a match fail condition occurred within a phrase. Address 1 is driven onto the pointer output 123 of the CAM 122.

Since the value of the length counter is 2, signal OUTR changes to logic 1 and selects the output of buffer 142 for routing to the register 148. The adder 140 now performs an offset calculation, receiving the last address of 0 from the flipflop 136, and the value of minus 1 obtained using two's complement arithmetic by adding the carry of 1 to the inverted pointer at the output of multiplexer 128. Since tag 124 is logic 0 indicating a match fail signal REQ_M2CROL is asserted and the offset value of 3 routed from the buffer 142 to the register 148 through multiplexers 144 and 146 is written into the register 148. Signal REQ_M2CROL also causes the length value of 2 to be written into register 104 from the length counter 106.

In step 309, the sliding window contains the phrase "dbad". The first character of the text following the sliding window is "a", which matches a matching character, the third character, in the sliding window. The sliding window is moved. The next character "a" of the text does not match the character "d" that follows the matching character in the sliding window, so the matched phrase consists of the single character "a". As the matched phrase has only a single character, the matched character is furnished as output in preference to the <O,L> coding.

Step 309 is implemented in the architecture of FIG. 2 generally as described for the implementation of step 307.

In step 310, the sliding window contains the phrase "bada". The character of the text following the sliding window is "a", which matches two matching characters, the second and fourth characters, in the sliding window. The sliding window is moved. The character now following the sliding window is "b", which does not match either of the characters following the matching characters in the sliding window. Hence, the matched phrase consists of the single character "a". As the matched phrase is only a single character, the matched character is furnished as output in preference to the <O,L> coding.

Step 310 is implemented in the architecture of FIG. 2 generally as described for the implementation of step 305.

In step 311, the sliding window contains the phrase "adaa". The first character of the text following the sliding window is "b", which has no match in the sliding window. The character "b" is therefor identified as a raw character and furnished as output. The sliding window is moved to envelop the raw character (see step 312).

Step 311 is implemented in the architecture of FIG. 2 generally as described for the implementation of step 306.

In step 312, the sliding window contains the phrase "daab". The first character of the text following the sliding window is "a", which matches two matching character, the second and third characters, in the sliding window. The sliding window is moved. The character "b" now following the sliding window matches the character following one of the first matching characters in the sliding window, which becomes the second matching character. The sliding window is again moved. The character "a" now following the sliding window matches the character following the second matching character in the sliding window, which becomes the third matching character. The sliding window is again moved. The next character "c" now following the sliding window does not match the character following the third matching character in the sliding window. Hence, the matched phrase is "aba", which has a length of three characters and corresponds to a matching phrase offset of two characters. The code <2,3> is furnished as output.

Step 312 is implemented in the architecture of FIG. 2 as follows. Since a new phrase comparison operation is beginning, signal FST is asserted and resets the length counter 106. Signal ACK_M2C is asserted to write the character "a" to register 110, from which the character is routed by demultiplexer 112 and multiplexer 118 to the match/write port of CAM 122, which is in compare mode. A match is detected at addresses 1 and 2, which sets the COMP bits at addresses 1 and 2 to enable a compare operation at addresses 2 and 3, and sets the tag 124 to logic 1. In accordance with signal ACAL, multiplexer 138 selects the output of the flipflop 136 for application to the adder 140. The pointer output 118 of the CAM 122 contributes through the 0 input of the inverting multiplexer 128 the binary value 0 to an input of the adder 140. The flipflop 136 contains the last address of 3, to which a carry 1 is added in adder 140 for forming the current address of 0. The current address is buffered in buffer 142. Since the value of 0 contained in the length counter 106 is not two or greater, output routing signal OUTR remains 0 to select the output of the delay flipflop 116 for routing a raw character through multiplexer 146 to the output register 148. Then, signal CAMW is asserted to (a) latch the current address of 0 from buffer 142 into address latch 132 and write the raw character "a" to the CAM 122 at the current address; (b) write the current address into flipflop 136; (c) write the raw character to flipflop 116, from where it is routed through multiplexers 144 and 146 to the register 148; and (d) advance the length counter 106 from 0 to 1. Since tag 124 is logic 1 indicating a match, signal REQ_M2CROL is not asserted and the raw character "a" is not written into the register 148.

Step 312 continues with an assertion of signal ACK_M2C, which causes the next character "b" to be written to register 110. The output of the register 110 is routed by demultiplexer 112 and multiplexer 118 to the match/write port of CAM 122, which is in compare mode. While addresses 2 and 3 are enabled for compare operations, a match is detected only at address 3. Only the COMP bit at address 3 is set to enable a compare operation at address 0. The tag 124 remains at logic 1. In accordance with signal ACAL, multiplexer 138 selects the output of the flipflop 136 for application to the adder 140. The pointer output 123 of the CAM 122 contributes through the 0 input of the inverting multiplexer 128 the binary value 0 to an input of the adder 140. The flipflop 136 contains the last address of 0, to which a carry 1 is added in adder 140 for forming the current address of 1. The current address is buffered in buffer 142. Since the value of 1 contained in the length counter 106 is not two or greater, output routing signal OUTR remains 0 to select the output of the delay flipflop 116 for routing a raw character through multiplexer 146 to the output register 148. Then, signal CAMW is asserted to (a) latch the current address of 1 from buffer 142 into address latch 132 and write the raw character "b" to the CAM 122 at the current address; (b) write the current address into flipflop 136; (c) write the raw character to flipflop 116, from where it is routed through multiplexers 144 and 146 to the register 148; and (d) advance the length counter 106 from 1 to 2. Since tag 124 is logic 1 indicating a match, signal REQ_M2CROL is not asserted and the raw character "d" is not written into the register 148.

Step 312 continues with an assertion of signal ACK_M2C, which causes the next character "a" to be written to register 110. The output of the register 110 is routed by demultiplexer 112 and multiplexer 118 to the match/write port of CAM 122, which is in compare mode. Address 0 is enabled for compare operations, and a match is detected at address 0. Only the COMP bit at address 0 is set to enable a compare operation at address 1. The tag 124 remains at logic 1. Signal ACAL remains statically asserted to implement an address calculation, in accordance with which multiplexer 138 selects the output of the flipflop 136 for application to the adder 140. The pointer output 123 of the CAM 122 contributes through the 0 input of the inverting multiplexer 128 the binary value 0 to an input of the adder 140. The flipflop 136 contains the last address of 1, to which a carry 1 is added in adder 140 for forming the current address of 2. The current address is buffered in buffer 142. Since the value of 2 contained in the length counter 106 is two or greater, output routing signal OUTR becomes logic 1 to select the output of the delay flipflop 116 for routing an offset value from the buffer 142 through multiplexer 146 to the output register 148. Then, signal CAMW is asserted to (a) latch the current address of 2 from buffer 142 into address latch 132 and write the raw character "a" to the CAM 122 at the current address; (b) write the current address into flipflop 136; and (c) advance the length counter 106 from 2 to 3. Although the raw character is also written to flipflop 116, that act is of no consequence since the multiplexer 144 no longer selects its 0 input. Since tag 124 is logic 1 indicating a match, signal REQ_M2CROL is not asserted and the value in buffer 142 is not written into the register 148.

Step 312 continues with another assertion of signal ACK_M2C, which causes the next character "c" to be written to register 110. The output of the register 110 is routed by demultiplexer 112 and multiplexer 118 to the match/write port of CAM 122, which is in compare mode. As address 1, the only address enabled for matching, does not contain a "c", a match fail condition is detected and the tag 124 is reset to logic 0. Signal CAMW is not asserted since a match fail condition occurred within a phrase. Address 0, the last match address, is driven onto the pointer output 123 of the CAM 122.

Since the value of the length counter is 3, signal OUTR remains logic 1 and selects the output of buffer 142 for routing to the register 148. The adder 140 now performs an offset calculation, receiving the last address of 2 from the flipflop 136, and the value of minus 0 obtained using two's complement arithmetic by adding the carry of 1 to the inverted pointer at the output of multiplexer 128. Since tag 124 is logic 0 indicating a match fail, signal REQ_M2CROL is asserted and the offset value of 2 routed from the buffer 142 to the register 148 through multiplexers 144 and 146 is written into the register 148. Signal REQ_M2CROL also causes the length value of 3 to be written into register 104 from the length counter 106.

LZ1 decoding using the architecture of FIG. 3 with the output of the encoding example of FIG. 6 as input proceeds as follows. Note that signal CPR is a static logic 1 for decompression mode. Note also that the CAM 122 is not operated in compare mode, so that the pointer output 123 is pulled up and, when selected by multiplexer 128, applies a value of 0 to the adder 140. Flipflop 134 is reset, and flipflop 136 is set.

Consider using the output of step 301 as a first 12-bit data element comprising a raw byte bit and 8 bits of character data. This first data element is written to register 110 and in accordance with the state of the CPR signal, routed through the 1 output of the demultiplexer 112 to the 0 input of multiplexer 114 and the 1 input of multiplexer 128. The RAWBZ bit is siphoned off the output of the demultiplexer 112 and applied as a control signal to the multiplexer 114. As the data element is a raw byte, (a) signal RAWBZ is logic 0 and routes the raw byte to the match/write port of the CAM 122 through multiplexer 118; and (b) signal ACAL is asserted high which (i) causes multiplexer 128 to select the pulled up pointer output 123 of the CAM 122 for applying a zero value to the adder 140; and (ii) causes multiplexer 138 to select the output of set flipflop 136 for applying the last address value to the adder 140. Next, signal CAMW is asserted to (a) latch the current address into the address latch 132; (b) write the raw byte into the CAM 122 in accordance with a current address calculated by adder 140; (c) write the current address into the flipflop 136; and (d) write the next current address into the flipflop 134. Next, signal CAMR is asserted to read the raw character from the CAM 122, from where it is routed through multiplexer 146 to the register 148. The raw character is written into register 148 when signal REQ_M2CROL is asserted.

The outputs of steps 302–307 are applied as second through seventh data elements, and are decoded in a manner similar to the manner of decoding the first data element. At the end of processing of the seventh data element, the CAM 122 contains the string "cadb".

The eighth data element includes offset and length data rather than a raw byte. The length data is loaded into the length counter 106 through register 102. Counter 106 now functions as a count down counter, in accordance with the state of signal CPR. The offset data is written to register 110 and in accordance with the state of the CPR signal, routed through the 1 output of the demultiplexer 112 to the 0 input of multiplexer 114 and the 1 input of multiplexer 128. The RAWBZ bit is siphoned off the output of the demultiplexer 112 and applied as a control signal to the multiplexer 114. As the data element is not a raw byte, (a) signal RAWBZ is logic 1 and selects the output of the CAM 122 through inverting latch 120 for application to the match/write port of the CAM 122 through multiplexer 118; and (b) signal ACAL is asserted low which (i) causes multiplexer 128 to select the offset value of 3 from the demultiplexer 112 for application to the adder 140; and (ii) causes multiplexer 138 to select the current address of 3 at the output of set flipflop 134 (register 136 contains the value of 2). Next, signal ROE is asserted to latch the offset address of 0 from buffer 142, calculated by subtracting from the current address the offset using two's complement arithmetic in adder 140. Signal CAMR is asserted (a) to read the character "a" from the CAM 122 and route the byte through multiplexer 146 to the register 148, into which it is written in accordance With signal REQ_M2CROL; and (b) to decrement the length counter 106 by one. The character "a" is also applied to the match/write port of the CAM 122 through multiplexers 114 and 118.

Next, signal ACAL is asserted high which (i) causes multiplexer 128 to select the pulled up pointer output 123 of the CAM 122 for applying a zero value to the adder 140; and (ii) causes multiplexer 138 to select the output of set flipflop 136 for applying the last address value to the adder 140. Next, signal CAMW is asserted to (a) latch the current address of 3 from the buffer 142 into the address latch 132; (b) write the byte previously read from the CAM 122 into the CAM 122 in accordance with the latched current address; (c) write the current address of 3 from the buffer 142 into the flipflop 136; and (d) write the next current address of 0 into the flipflop 134.

As the length counter 106 is nonzero, signal ACAL is again asserted low which (i) causes multiplexer 128 to select the offset value of 3 from the demultiplexer 112 for application to the adder 140; and (ii) causes multiplexer 138 to select the current address of 0 at the output of set flipflop 134. Next, signal ROE is asserted to latch the offset address of 1 from buffer 142, calculated by subtracting from the current address 0 from flipflop 134 the offset of 3 using two's complement arithmetic in adder 140. Signal CAMR is again asserted (a) to read the character "d" from the CAM 122 and route the byte through multiplexer 146 to the register 148, into which it is written in accordance with signal REQ_M2CROL; and (b) to decrement the length counter 106 by one. The character "d" is also applied to the match/write port of the CAM 122 through multiplexers 114 and 118.

Next, signal ACAL is asserted high which (i) causes multiplexer 128 to select the pulled up pointer output 123 of the CAM 122 for applying a zero value to the adder 140; and (ii) causes multiplexer 138 to select the output of set flipflop 136 for applying the last address value of 3 to the adder 140. Next, signal CAMW is asserted to (a) latch the current address of 0 from buffer 142 into the address latch 132; (b) write the byte previously read from the CAM 122 into the CAM 122 in accordance with the latched current address; (c) write the current address of 0 into the flipflop 136; and (d) write the next current address of 1 into the flipflop 134.

As the length counter 106 contains zero, the offset and length information are fully decoded, and the illustrative CAM implementation is ready for the ninth data element.

The tenth and eleventh data elements are decoded in a manner similar to the decoding of the first data element, while the twelfth data element is decoded in a manner similar to the decoding of the eighth data element.

In one single-chip VLSI implementation of LZ1 processing, the interface 10 carried out a PC-AT 16 bit interface protocol and was run at from 8 to 20 MHz, while the compression engine 40 including the MODEL 30 was run at a frequency as high as 60 MHz. Implemented in this manner, the processor 1 achieved a sustained compression rate of seven Megabytes/second and a decompression rate of ten Megabytes/second.

Illustrative compression results attained by the compression engine 40 in the single-chip implementation are set forth in Table 2.

TABLE 2

| File | Original | Compressed | Ratio |
|---|---|---|---|
| Windows write.exe | 211,168 | 119,708 | 1.76 |
| Windows readme.txt | 33,407 | 14,626 | 2.28 |
| Windows chess.bmp | 153,718 | 17,240 | 8.92 |
| Autocad StPauls.dwg | 43,610 | 9,998 | 4.36 |
| Excel budget.xls | 21,011 | 8,560 | 2.45 |
| dBase employee.dbf | 12,288 | 4,174 | 2.94 |

While the invention has been described with respect to certain embodiments and variations, these embodiments and variations are illustrative and the invention is not to be considered limited in scope to them. The scope of the invention is defined by the following claims, which encompass other embodiments and variations not described herein.

What is claimed is:

1. An apparatus for compressing text comprising a plurality of characters, the text having groups of characters referred to as matched phrases that match preceding groups of characters in the text referred to as matching phrases, wherein the matched phrases are represented by pointer data individually comprising an offset value indicating the offset of the matched phrase from the matching phrase and a length value indicating the length of the matched phrase, comprising:

a content addressable memory ("CAM") for progressively storing portions of the text in addressable locations of the CAM and progressively comparing an input character from the text following the portion of the text stored in the CAM with the portion of the text stored in the CAM until a match fail results, said CAM having a pointer output for furnishing upon match fail a first address in the CAM of a character in the matching phrase;

a length counter responsive to match events in the CAM for counting the number of matches until the match fail results;

a register for storing a second address relative to the CAM of a character in a matched phrase corresponding to the character in the matching phrase having its address furnished by the CAM;

an adder receiving said pointer output and the output of said register for determining an offset value in accordance with the first and second addresses, upon a match event, the pointer output of said CAM effectively applying a zero value to said adder, said adder further receiving a one for incrementing the output of said register by one;

a second register for storing upon a match event a third address one greater than the address in said first register; and a first multiplexer for selecting said first register for application to said adder upon each match event during encoding and decoding modes, and selecting said second register for input to said adder upon a match fail event during decoding mode; and a second multiplexer for selecting the pointer output of said CAM for application to said adder during encoding mode and upon a match event during decoding mode, and selecting an offset value for application to said adder upon a match fail event during decoding mode;

wherein upon a match fail event during decoding mode, an offset address is calculated by said adder and applied to said CAM.

* * * * *